(12) United States Patent
Jarabek et al.

(10) Patent No.: US 7,042,913 B2
(45) Date of Patent: May 9, 2006

(54) METHOD AND SYSTEM FOR WRITING DATA TO MEMORY ELEMENTS

(75) Inventors: Andrew Jarabek, Nepean (CA); Aris Tombul, Ottawa (CA); Robert Gibbins, Stittsville (CA)

(73) Assignee: Nortel Networks Limited, St. Laurent (CA)

( * ) Notice: Subject to any disclaimer, the term of this patent is extended or adjusted under 35 U.S.C. 154(b) by 352 days.

(21) Appl. No.: 10/675,790

(22) Filed: Sep. 30, 2003

(65) Prior Publication Data

US 2005/0071594 A1 Mar. 31, 2005

(51) Int. Cl.
*H04J 3/07* (2006.01)
*G06F 1/04* (2006.01)

(52) U.S. Cl. .................. 370/506; 711/167; 713/500
(58) Field of Classification Search .......... 711/167; 370/379, 382, 503, 506, 359, 392, 360, 369; 714/400, 500, 600
See application file for complete search history.

(56) References Cited

U.S. PATENT DOCUMENTS

| | | | |
|---|---|---|---|
| 4,998,242 A * | 3/1991 | Upp | 370/392 |
| 5,872,780 A * | 2/1999 | Demiray et al. | 370/359 |
| 5,914,952 A * | 6/1999 | Eom et al. | 370/369 |
| 5,917,818 A * | 6/1999 | Ko et al. | 370/377 |
| 6,356,550 B1 * | 3/2002 | Williams | 370/364 |
| 6,449,292 B1 * | 9/2002 | Weeber | 370/517 |
| 6,674,714 B1 * | 1/2004 | Mochizuki et al. | 370/217 |
| 2003/0053494 A1* | 3/2003 | Mochizuki | 370/539 |
| 2004/0100994 A1* | 5/2004 | Miller | 370/503 |
| 2005/0068988 A1* | 3/2005 | Jarabek et al. | 370/506 |
| 2005/0068991 A1* | 3/2005 | Jarabek et al. | 370/516 |
| 2005/0071718 A1* | 3/2005 | Jarabek et al. | 714/736 |

* cited by examiner

*Primary Examiner*—Hong Kim
(74) *Attorney, Agent, or Firm*—Jeffrey M. Measures; Borden Ladner Gervais LLP

(57) ABSTRACT

A technique for provisioning cross-connects in network switching environment includes writing a first set of data into a first memory element during a first time interval and writing a second set of data into a second memory element during a second time interval. The technique reads a portion of the first set of data from the first memory element during the second time interval and reads a portion of the second set of data from the second memory element during a third time interval, and determines the first, second, and third time intervals based on a format of the sets of data, with the first time interval ending before the second time interval begins, and the second time interval ending before the third time interval begins.

18 Claims, 3 Drawing Sheets

Reads of VT 1.5 structured streams

Reads of VT 2 structured streams

METHOD AND SYSTEM FOR WRITING DATA TO MEMORY ELEMENTS

BACKGROUND

Synchronous data communications networks can carry payload data within a data stream using any one of a variety of physical layer communication protocols (e.g., using the Synchronous Digital Hierarchy (SDH), or Synchronous Optical Network (SONET) protocol). SONET and SDH use time-division multiplexing (TDM) to combine multiple "low-order" data blocks (such as a Tributary Unit (TU) in SDH, or a Virtual Tributary (VT) in SONET) into a "high-order" data block called a "frame" (e.g., an STS frame). The low-order blocks may be further sub-divided into segments of data associated with different channels.

It is sometimes useful to switch payload data from one channel to another channel using a cross-connect device. Channels can be switched in aggregate blocks. For example, a block of data in a location within a data stream corresponding to one VT time slot can be switched to a location within the data stream corresponding to another VT time slot. A cross-connect device that is capable of switching low-order blocks within high-order frames of a data stream can be built using a random access memory (RAM). An associated processor controls writing of an incoming data stream into the RAM and subsequent reading of an outgoing data stream from the RAM to provide cross-connection. The processor control logic and RAMs used to perform the switching are typically constructed in an integrated circuit.

SUMMARY

In general, in one aspect, the invention features a method including writing a first set of data into a first memory element during a first time interval, writing a second set of data into a second memory element during a second time interval, reading a portion of the first set of data from the first memory element during the second time interval, reading a portion of the second set of data from the second memory element during a third time interval, and determining the first, second, and third time intervals based on a format of the sets of data. The first time interval ends before the second time interval begins, and the second time interval ends before the third time interval begins.

Embodiments of the invention may include one or more of the following features.

The first set of data and the second set of data each comprise a portion of an incoming data stream.

The method includes determining the portion of the first set of data based on connection information associated with the incoming data stream, and determining the portion of the second set of data based on the connection information.

Writing the first set of data is performed over one or more bi-directional ports, and reading a portion of the first set of data is performed over the one or more bi-directional ports.

Writing the second set of data is performed over one or more bi-directional ports, and reading a portion of the second set of data is performed over the one or more bi-directional ports.

The determining occurs prior to writing the first and second sets of data and reading the portions of the first and second sets of data.

The first set of data and the second set of data each comprise a portion of a block of data having one of a plurality of types of low-order multiplexing formats.

The determining includes determining a size of memory space used to store the first set of data within the first memory element, and determining time used to access the determined size of memory space used to store the first set of data, and determining a size of memory space used to store the second set of data within the second memory element, and determining time used to access the determined size of memory space used to store the second set of data.

The size of memory space used to store the first set of data and the size of memory space used to store the second set of data are based on the plurality of types of low-order multiplexing formats.

In general, in another aspect, the invention features an apparatus including an input write bus, a first memory element in electrical communication with the input write bus, a second memory element in electrical communication with the input write bus, and circuitry. The circuitry is configured to write a first set of data into the first memory element during a first time interval, write a second set of data into the second memory element during a second time interval, read a portion of the first set of data from the first memory element during the second time interval, read a portion of the second set of data from the second memory element during a third time interval, and determine the first, second, and third time intervals based on a format of the sets of data. The first time interval ends before the second time interval begins, and the second time interval ends before the third time interval begins.

In general, in another aspect, the invention features a computer program product tangibly embodied on a computer readable medium, for provisioning cross-connects in network switching environment comprising instructions for causing a computer to write a first set of data into the first memory element during a first time interval, write a second set of data into the second memory element during a second time interval, read a portion of the first set of data from the first memory element during the second time interval, read a portion of the second set of data from the second memory element during a third time interval, and determine the first, second, and third time intervals based on a format of the sets of data. The first time interval ends before the second time interval begins, and the second time interval ends before the third time interval begins.

Other features and advantages of the invention will become apparent from the following description, and from the claims.

DESCRIPTION

Figure 1:
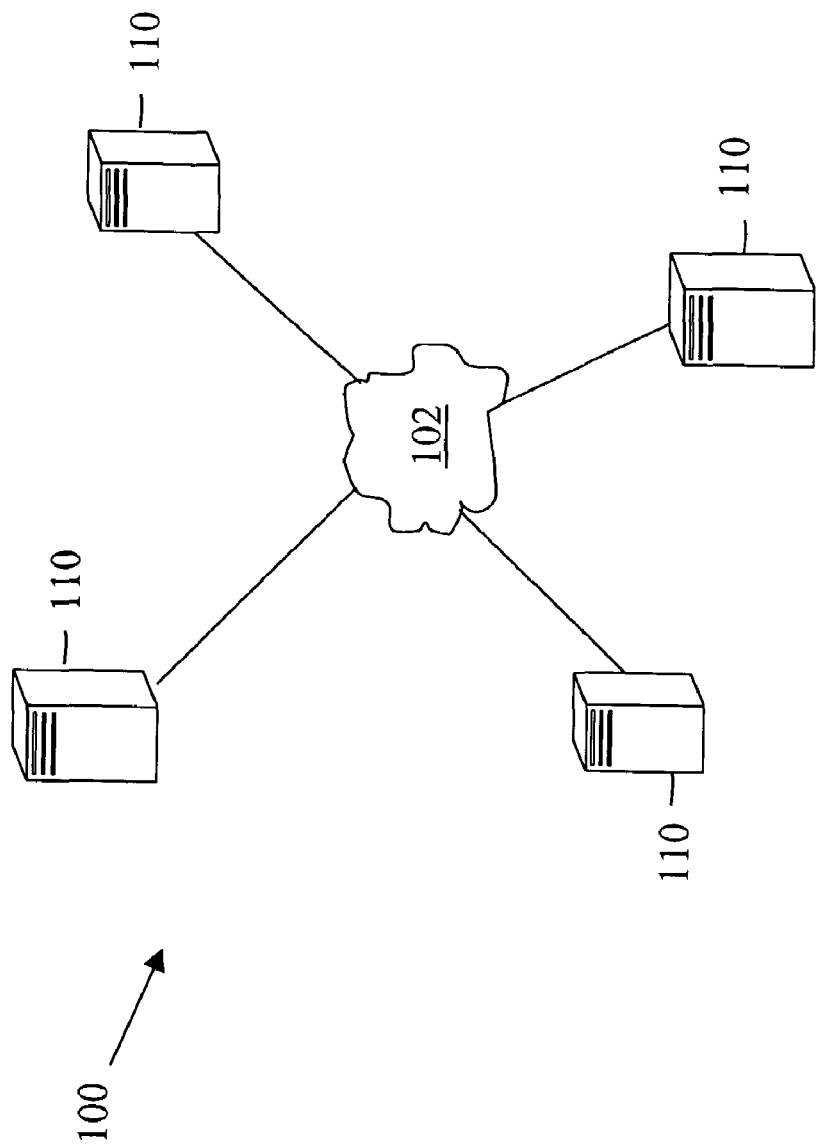
FIG. 1 is a diagram depicting a synchronous communication system.

Referring to FIG. 1, a synchronous communication system 100 includes network elements 110 in communication with one another via a network infrastructure 102. The network infrastructure 102 may include other network elements or nodes, and/or sub-networks, arranged in configurations such as a ring configuration, a hub configuration, a point-to-point configuration, and so forth. The network elements may include synchronous transmission devices such as a multiplexer, a regenerator or a cross-connect. The network 100 transmits data using a physical layer communication protocol such as SONET or SDH.

Some of the network elements 110 in the network 100 perform switching of data channels using a cross-connect device (not shown). The cross-connect device controls the flow of data into a data buffer so that bytes of data located in specific locations within a high-order frame are written to specific memory locations. These predetermined specific memory locations hold data bytes from each of the individual low-order blocks. The cross-connect device reads data out of the data buffer using connection information stored in a connection memory to determine which specific memory location to read from in the data buffer. The order in which the specific memory locations are read determines how low-order blocks are switched.

Since low-order blocks are multiplexed into a high order frame based on a repeating pattern, it is not necessary to write an entire frame into the data buffer before reading data out in the determined order. For example, the cross-connect device may store only one byte from each low-order block before assembling outputs based on the connection memory information. As a result, the data buffer can be re-used in time to store multiple sequences of bytes from the same frame.

In addition to rearranging data in different time slots within a data stream using TDM, a cross-connect device can have multiple input and output data lines to enable switching of multiple data streams among the data lines. To switch data from any low-order block within an incoming data stream on an input data line to any outgoing data stream on an output data line, the cross-connect device should have access to bytes from every low-order block within a frame.

This can be achieved (e.g., in an integrated circuit) through the use of a large multi-port memory element: one write port is used for writing data into the memory element and N read ports are used for reading the data out. Each of the N read ports has an associated connection memory. The N read ports of the memory element provide N outgoing data streams (e.g., for N output data lines) where each read port has access to the data written via the write port.

Various techniques can be used to provide extra read ports from those available on an existing memory element. For example, if a memory element with M read ports is read twice in the same interval of time, the memory element behaves as if it has twice as many (2M) read ports as it has when it is read once in that interval of time. Another technique is to use a write port for reading when it is not being used to write (e.g., in memory elements with bi-directional ports). Effective use of ports on one or more memory elements in a cross-connect device can reduce the overall memory space used for switching a given bandwidth of data, potentially reducing the cost and size of the cross-connect device.

The memory space used by a cross-connect device can be partitioned into separate memory elements having respective ports used to support simultaneous reading and writing of the data to be switched. A savings in memory space of 1/N can be achieved, where N is number of read ports available on each memory element. In one example, a 5-way memory partitioning technique can be used to reduce the memory space used to switch low order data blocks that arrive on an incoming data stream in one of two multiplexing formats for the low-order VT group, VT1.5 or VT2 (or, in SDH terms, a high-order TUG-2 stream with low-order TU11 or TU12 streams).

Figure 2:
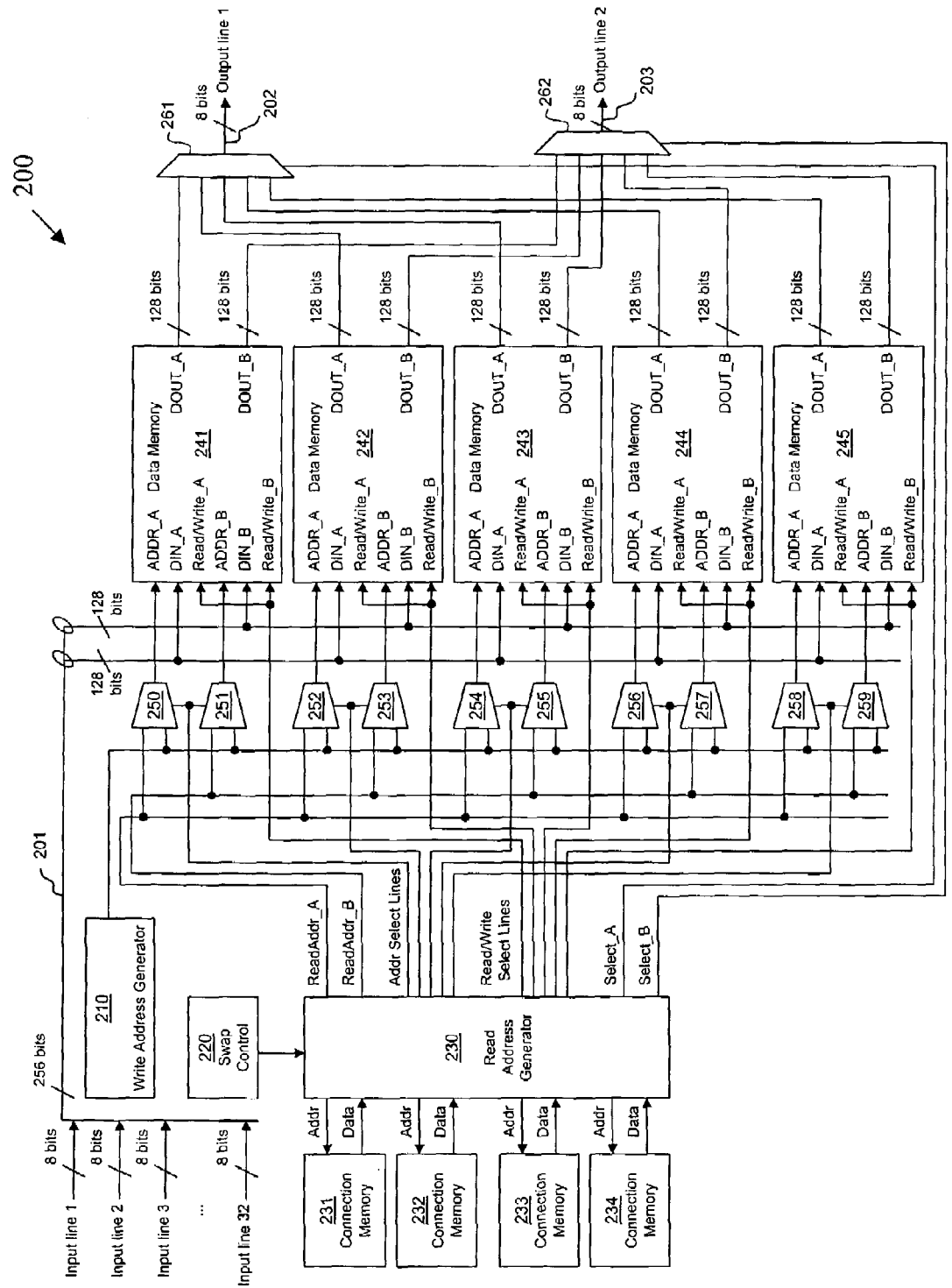
FIG. 2 is a block diagram depicting a processing block within a cross-connect device.

Referring to FIG. 2, a block diagram of a processing block 200 of a cross-connect device shows components used to support two outgoing data streams, one outgoing data stream on a first output data line 202, and another outgoing data stream on a second output data line 203. In this example, the processing block 200 uses five dual-port memories devices 241–245 (e.g., RAM) to select data from any of 32 incoming data streams over input lines 1–32 aggregated on an input write bus 201 (each incoming data stream having a bandwidth of 2.5 Gbps for a combined bandwidth of 80 Gbps), and send out either of two 2.5 Gbps outgoing data streams. The cross-connect device uses 16 such processing blocks to switch data from any one of the incoming data streams into any one of the 32 outgoing data streams. The memory elements are sized to support both VT1.5 and VT2 low-order multiplexing formats.

Each of the five memory elements has two bi-directional ports that can write data simultaneously into two different address locations, and can read data simultaneously from two different address locations. A bi-directional port is supported by address decoding circuitry that is shared between either a writing or a reading function, but not both functions simultaneously on the same bi-directional port. The input write bus 201 has a width of 256 bits to support writing the combined input bandwidth (for 80 Gpbs, 32 8-bit wide input streams at 311 Mbps). Each bi-directional port has a width of 128 bits to write half of the bits on the input write bus. A write address generator 210 controls the flow of data into the five memory elements by providing write address locations for each of the two ports on the memory element selected for writing at any given time. The payload data within the incoming data streams coming over the bus 201 are descrambled and are synchronized by an upstream device (e.g., by a link termination overhead processor and VT/TU synchronization device).

A read address generator 230 retrieves connection information from a connection memory 231 for data to be sent on the first output data line 202, and retrieves connection information from a connection memory 233 for data to be sent on the second output data line 203. The connection information determines how the low-order data blocks are to be switched by determining read addresses for each of the two ports on the memory element selected for reading at any given time. The read address generator 220 provides a memory select signal to a first multiplexer 261 that selects one of the five memory elements from which to read for the first output data line 202, and provides a memory select signal to a second multiplexer 262 that selects one of the five memory elements from which to read for the second output data line 203.

Associated with an active connection memory 231 is a standby connection memory 232 that is used to load new connection information while the active connection memory 225 is in use. A swap control module 220 determines which connection memory is used as the active connection memory. The active connection memory 233 also has an associated standby connection memory 234. Memory elements 241–245 are sized to accommodate storage of a pre-determined number of bytes from each of 48 high-order frames (e.g., STS-1 frames) within each of 32 incoming data streams flowing into the input write bus 201. Memory element 241 stores 3 bytes from each frame which leads to a minimum size of 3×8×48×32=36,864 bits (e.g., 128 bits wide by 288 rows deep). Memory elements 242 and 244 store 15 bytes from each frame which leads to a minimum size of 15×8×48×32=184,320 bits (e.g., 128 bits wide by 1440 rows deep). Memory elements 243 and 245 store 14 bytes from each frame which leads to a minimum size of 14×8×48×32=172,032 bits (e.g., 128 bits wide by 1344 rows deep).

Figure 3:
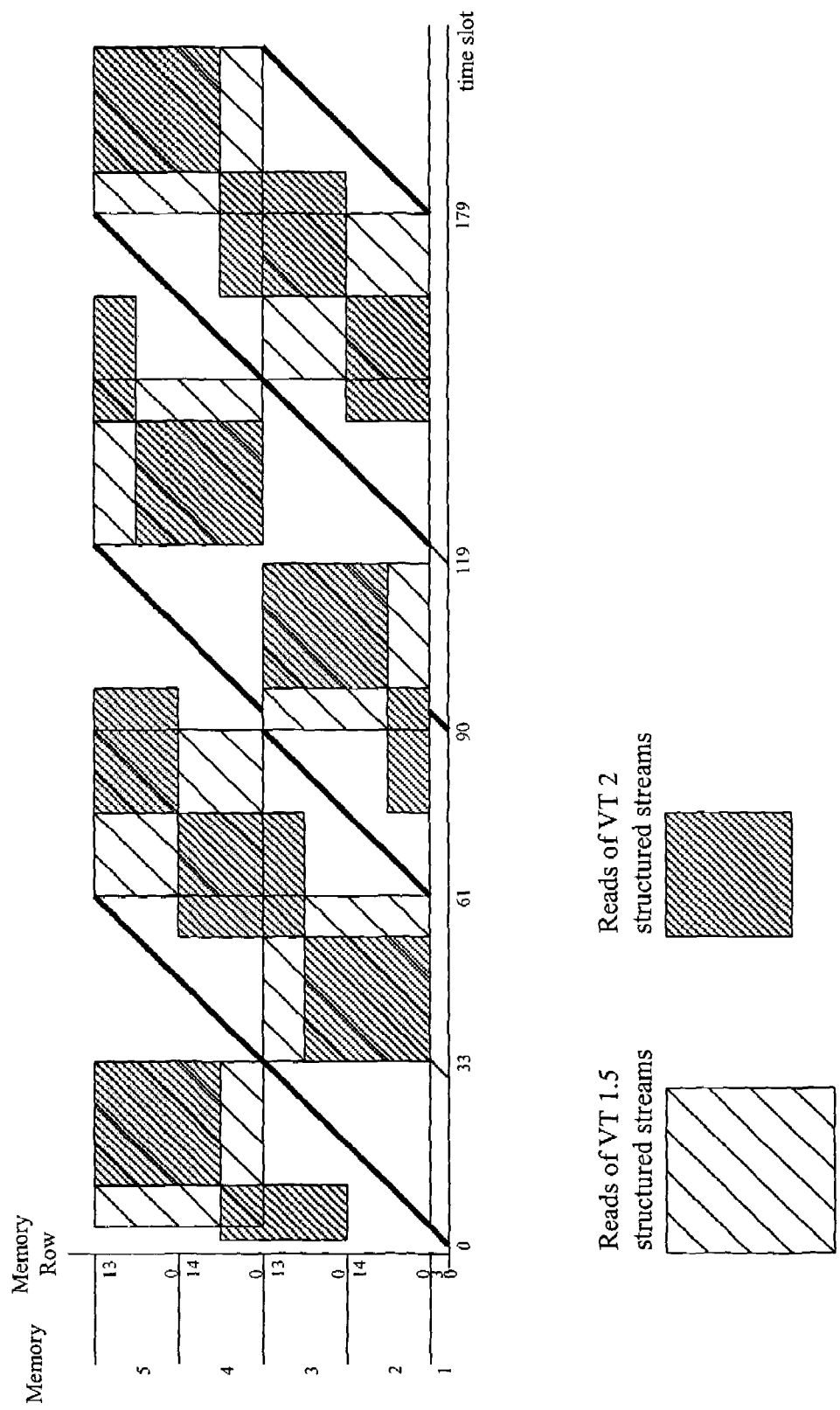
FIG. 3 is a graph of a sequence for writing into and reading from memory elements in the cross-connect device.

Referring to FIG. 3, a graph of an example write and read sequence for the memory elements shows memory locations (locations within each of the five memory elements 241–245 labeled 1–5, and row locations within the memory element labeled 0-max row) on the vertical axis and time on the horizontal axis. Row locations are compressed for clarity such that each row represents 1 byte from each of 48 frames within an input stream. The time axis is in units of "time slots" representing time intervals used to read or write one byte from each of 48 frames within an input stream (i.e., 48 311 MHz cycles).

The sequence in which incoming data segments are written to the memory elements is shown as a heavy diagonal line. The sequence in which outgoing data segments are read from the memory elements is shown by a thin diagonal line for memory element 241 and by a rectangular region shaded by diagonal hash lines for memory elements 242–245. The rectangular regions represent potential row locations from which data can be read based on switching behavior determined by the connection information. Two different types of diagonal hash lines represent the two different potential types of low-order multiplexing formats that can be read (VT1.5 and VT2).

The write and read sequence shown in FIG. 3 is for an STS-1 frame with the SONET/SDH payload envelope at a pointer offset of 522. Alternatively, the sequence can be modified for a different pointer offset and rate. Assuming that frames from all 32 input streams arrive for writing onto the input write bus 201 during time slot '0', FIG. 3 shows the write and read sequence that is followed to perform switching on the data. During time slot '0', a transport overhead (TOH) byte is stored in memory element 241 at row '0'. The two 128-bit wide write ports are used to store 32×48=1536 8-bit bytes over the course of one time slot in memory element 241 (filling one third of its 128×288 size). The process is repeated for the next two TOH bytes for time slots '1' and '2'.

During time slot '3' a Path Overhead (POH) byte is written into memory element 242. During time slots '4' through '17', low-order data bytes (e.g., a VT1.5 or VT2 group) are written into memory element 242. During time slots '18' through '31', low-order data bytes are written to memory element 243. During times lots '29' through '31' memory element 241 can be read (as controlled by read address generator 230). Two rows of data are retrieved from memory element 241 under control of the read address generator 230. One row address is applied through multiplexer 250 and the other row address is applied through multiplexer 251. The output data corresponding to each of these row addresses is applied to multiplexers 261 and 262 respectively. Read address generator 230 applies a select signal to multiplexer 261 to select an 8-bit wide word from the five 128-bit words available at the multiplexer input. The 8-bit wide 311 Mbps outgoing data stream is applied to output line 202. The other output port of memory 241 is connected to multiplexer 262 to form an 8-bit wide 311 Mbps outgoing data stream over output line 203. Each outgoing data stream is independent of the other and is controlled by independent connection information stored in an associated connection memory.

During time slots '32' to '60', bytes are sequentially written to memory elements 244 and 245. While memory elements 244 and 245 are being written, memory elements 242 and 243 are available for reading. The read address generator 230 determines read addresses according to the connection information in the connection memories.

The writing and reading of data continues according to this sequence with memory elements 241–245 being re-used (i.e., re-written with new information) once the stored data has been retrieved. The period of repetition for this sequence is 180 timeslots (corresponding to 2 STS rows). Both read and write activity do not occur within the same time slot for any of the memory elements. Thus a 2-port memory element may be used as virtual 4-port memory element for each of the five memory elements since each memory element alternates in time between two simultaneous read cycles and two simultaneous write cycles.

Another feature of this write and read sequence is that switching of low-order data in either one of two multiplexing formats (VT1.5 or VT2) is possible. The cross-connection device uses seven control bits per STS-1 frame to select between the two types of multiplexing formats. Each of these seven bits is used to specify the type for one of the seven VT groups within an STS-1 frame. The time slots during which reading activity may occur vary based on the type of the VT group being read from memory elements 242–245.

Other embodiments are within the scope of the following claims.

What is claimed is:

1. A method comprising:
   writing a first set of data into a first memory element during a first time interval;
   writing a second set of data into a second memory element during a second time interval;
   reading a portion of the first set of data from the first memory element during the second time interval;
   reading a portion of the second set of data from the second memory element during a third time interval; and
   determining the first, second, and third time intervals based on a format of the sets of data, with the first time interval ending before the second time interval begins, and the second time interval ending before the third time interval begins.

2. The method of claim 1 wherein the first set of data and the second set of data each comprise a portion of an incoming data stream.

3. The method of claim 2 further comprising:
   determining the portion of the first set of data based on connection information associated with the incoming data stream; and
   determining the portion of the second set of data based on the connection information.

4. The method of claim 1 wherein writing the first set of data is performed over a bi-directional port, and reading a portion of the first set of data is performed over the bi-directional port.

5. The method of claim 1 wherein writing the second set of data is performed over a bi-directional port, and reading a portion of the second set of data is performed over the bi-directional port.

6. The method of claim 1 wherein writing the first set of data is performed over a plurality of bi-directional ports, and reading a portion of the first set of data is performed over the plurality of bi-directional ports.

7. The method of claim 1 wherein writing the second set of data is performed over a plurality of bi-directional ports, and reading a portion of the second set of data is performed over the plurality of bi-directional ports.

8. The method of claim 1 wherein the determining occurs prior to writing the first and second sets of data and reading the portions of the first and second sets of data.

9. The method of claim 1 wherein the first set of data and the second set of data each comprise a portion of a block of data having one of a plurality of types of low-order multiplexing formats.

10. The method of claim 9 wherein the determining comprises:
   determining a size of memory space used to store the first set of data within the first memory element, and determining time used to access the determined size of memory space used to store the first set of data; and
   determining a size of memory space used to store the second set of data within the second memory element, and determining time used to access the determined size of memory space used to store the second set of data.

11. The method of claim 10 wherein the size of memory space used to store the first set of data and the size of memory space used to store the second set of data are based on the plurality of types of low-order multiplexing formats.

12. An apparatus comprising:
   an input write bus;
   a first memory element in electrical communication with the input write bus;
   a second memory element in electrical communication with the input write bus; and
   circuitry configured to
      write a first set of data into the first memory element during a first time interval;
      write a second set of data into the second memory element during a second time interval;
      read a portion of the first set of data from the first memory element during the second time interval;
      read a portion of the second set of data from the second memory element during a third time interval; and
      determine the first, second, and third time intervals based on a format of the sets of data, with the first time interval ending before the second time interval begins, and the second time interval ending before the third time interval begins.

13. The apparatus of claim 12 wherein the first set of data and the second set of data each comprise a portion of an incoming data stream applied to the write bus.

14. The apparatus of claim 13 further comprising:
   a third memory element in electrical communication with the input write bus;
   a fourth memory element in electrical communication with the input write bus; and
   a fifth memory element in electrical communication with the input write bus.

15. The apparatus of claim 14 wherein the circuitry is further configured to store portions of the incoming data stream in each of the third, fourth, and fifth memory elements.

16. The apparatus of claim 13 further comprising a connection memory configured to store connection information associated with the incoming data stream.

17. The apparatus of claim 16 further comprising a read address generator configured to:
   determine the portion of the first set of data based on the connection information; and
   determine the portion of the second set of data based on the connection information.

18. A computer program product tangibly embodied on a computer readable medium, for provisioning cross-connects in network switching environment comprising instructions for causing a computer to:
   write a first set of data into a first memory element during a first time interval;
   write a second set of data into a second memory element during a second time interval;
   read a portion of the first set of data from the first memory element during the second time interval;
   read a portion of the second set of data from the second memory element during a third time interval; and
   determine the first, second, and third time intervals based on a format of the sets of data, with the first time interval ending before the second time interval begins, and the second time interval ending before the third time interval begins.

* * * * *